United States Patent [19]
Ono

[11] Patent Number: 5,978,758
[45] Date of Patent: Nov. 2, 1999

[54] VECTOR QUANTIZER WITH FIRST QUANTIZATION USING INPUT AND BASE VECTORS AND SECOND QUANTIZATION USING INPUT VECTOR AND FIRST QUANTIZATION OUTPUT

[75] Inventor: Shigeru Ono, Tokyo, Japan

[73] Assignee: NEC Corporation, Tokyo, Japan

[21] Appl. No.: 08/890,881

[22] Filed: Jul. 10, 1997

[30] Foreign Application Priority Data

Jul. 10, 1996 [JP] Japan ................................. 8-179714

[51] Int. Cl.$^6$ ................................................. G10L 3/02
[52] U.S. Cl. ................................ 704/222; 704/501
[58] Field of Search ............................... 704/221–223, 704/217, 230, 264, 500, 501

[56] References Cited

U.S. PATENT DOCUMENTS

| | | | |
|---|---|---|---|
| 4,817,157 | 3/1989 | Gerson | 704/230 |
| 5,151,968 | 9/1992 | Tanaka et al. | 704/200 |
| 5,263,119 | 11/1993 | Tanaka et al. | 704/223 |
| 5,636,322 | 6/1997 | Ono | 704/222 |
| 5,659,659 | 8/1997 | Kolesnik et al. | 704/219 |
| 5,675,702 | 10/1997 | Gerson et al. | 703/223 |

FOREIGN PATENT DOCUMENTS

| | | | |
|---|---|---|---|
| 2-502135 | 7/1990 | Japan . | |
| 3-228433 | 10/1991 | Japan | G10L 9/18 |
| 4-35418 | 2/1992 | Japan | H03M 7/30 |
| 7-273660 | 10/1995 | Japan | H03M 7/30 |
| WO 94/07239 | 3/1994 | WIPO | G10L 9/14 |

OTHER PUBLICATIONS

Conway et al., "Fast Quantizing and Decoding Algorithms for Lattice Quantizers and Codes", IEEE Transactions on Information Theory, vol. IT–28, No. 2, 227–232 (1982).

Leblanc et al., "Structured Codebook Design in CELP", Proc. International Mobile Satellite Conference, pp. 667–672 (1991).

Primary Examiner—David R. Hudspeth
Assistant Examiner—Donald L. Storm
Attorney, Agent, or Firm—Foley & Lardner

[57] ABSTRACT

A first vector quantizer generates output codevectors corresponding in number to a number determined by a predetermined number of bits through linear coupling of integer coefficients of a predetermined number of base vectors stored in a base vector memory. A second vector quantizer determines coefficients of the base vectors according to at least one of output indexes of the output codevectors.

6 Claims, 9 Drawing Sheets

VECTOR QUANTIZER WITH FIRST QUANTIZATION USING INPUT AND BASE VECTORS AND SECOND QUANTIZATION USING INPUT VECTOR AND FIRST QUANTIZATION OUTPUT

BACKGROUND OF THE INVENTION

The present invention relates to a vector quantizer and, more particularly, to a vector quantizer for low bit rate coding time-sequential signals such as speech signals and image signals.

Vector quantization is a typical method of quantizing time-series signals such as speech signals and image signals by dividing the input signal into a plurality of frames with a predetermined interval (or blocks with a predetermined area). The vector quantization is excellent in the quantization performance in the sense that this method can reduce the quantizing distortion with respect to the number of assigned bits. This method, however, requires great deals of computational effort and storage capacity for the retrieval of an optimum quantization output vector which best represents the quantization signal.

For example, in vector quantization with 0.5 bit per sample and 40 vector dimensions, the computational effort (i.e., number of AND/ORing times) and storage capacity for the retrieval are $40 \times 20^2$ per vector. This means that where a speech signal of 8 Khz sampling is dealt with, the computational effort is a little higher than about $1660 \times 10^6$ per second. This operational scale is impossible with a single chip of DSP (Digital Signal Processor).

In the case of possible application of a plurality of high bit rate DSPs in parallel, increases of the price, power consumption, installation area, etc. are inevitable, thus disabling the application of the method to portable terminals or the like.

Various methods for executing vector quantization with less computational scales have heretofore been investigated. A basic method for the computational scale reduction is "structuring", in which some restrictions are provided among codevectors constituting a vector quantizer.

A typical method of structuring is vector sum quantization, which is disclosed in Japanese Patent Laid-Open Heisei 2-502135. Among other typical methods of structuring is lattice vector quantization as shown in, for instance, J. H. Conway and N. J. A. Sloane, "First Quantizing and Decoding Algorithms for Lattice Quantizers and Codes", IEEE Trans. Inf. Theory, Vol. IT-28, pp. 227–232, 1982, and R. M. Gray Source Coding Theory, Ch. 5.5, Kluwer Academic Publishers, 1990.

These vector quantizers feature in generation of codevectors by arithmetic operations of predetermined base vectors with or without multiplication by an integer. Specifically, denoting M base vectors by $\{a_i, i=1,\ldots,M\}$, a k-th codebook is given as:

$$V_k = \sum_{i=1}^{M} u_{ki} \cdot a_i \quad (1)$$

where $\{u_{ki}\}$ is integers.

In the vector sum quantization, the coefficient $u_{ki}$ take as values of "1" or "−1", and $2^M$ vectors are generated.

In such a vector quantization, the computational effort can be greatly reduced by providing appropriate contrivances with respect to the character of the arithmetic operations and the retrieval sequence so long as the number M of the base vectors is considerably small compared to the number L of the vector dimensions. For example, the computational effort in the vector quantization is reduced by providing the following contrivance in the retrieval step.

Denoting an n-th frame input vector by $x_n$, base vectors by $\{a_i, i=1,\ldots,M\}$, the coefficient vector of a k-th codevector by $\{u_{ki}, i=1,\ldots,M\}$, a k-th codebook is retrieved by using an evaluating function $J_k$ given as:

$$J_k = \left\| x_n - \sum_i u_{ki} \cdot a_i \right\|^2 \quad (2)$$

$$= \|x_n\|^2 - 2\sum_i u_{ki} \cdot a_i^t \cdot x_n + \left\| \sum_i u_{ki} \cdot a_i \right\|^2$$

where t attached to ai indicates transposition.

It is assumed that $u_{ki}$ is "1" when an i-th bit is "0" for k expressed by the binary expression and "−1" when the i-th bit is "1" and that $u_{(k+1)i} = -u_{ki}$ and $u_{(k+1)j} = u_{kj}$ (j≠i).

Then, $J_k$ and (k+1)-th evaluating function $J_{k+1}$ are related as:

$$J_{k+1} = J_k + 2u_{(k+1)i} \cdot a_i^t \cdot x_n + \quad (3)$$

$$4\sum_{m=1}^{i-1} u_{(k+1)m} \cdot u_{(k+1)i} \cdot a_m^t \cdot a_j + 4\sum_{m=i+1}^{M} u_{(k+1)m} \cdot u_{(k+1)i} \cdot a_m^t \cdot a_i$$

By setting L as the vector dimension number, the computational effort (number of AND/ORing times) $C_{vsum}$ that is required for the retrieval in this case is:

$$C_{vsum} = L + ML + (\tfrac{1}{2})M(M+1)L + (2^{M-1}-1) + M(2^{M-1}-1) \quad (4)$$

The AND/ORing times number $C_{norm}$ that is necessary for the usual vector quantizer is $C_{norm} = L2^M$.

Thus, if $M \ll L$, we have $C_{vsum} \ll C_{norm}$.

The above prior art quantizing systems such as the vector sum quantizing system and the lattice vector quantizing system, feature in that the computational effort for the codevector retrieval can be greatly reduced. In these vector quantizing systems, however, codevectors are generated by arithmetic operations of base vectors with or without multiplication by an integer. Therefore, the codevector generation is greatly restricted, and the quantizers are greatly inferior in performance to non-structured vector quantizers.

For example, it was reported that with respect to speech signals the vector sum quantization is inferior in performance by 2 dB or more at 8 kb/s to the non-structured vector quantization (LeBlanc, W. P and Mahmound, S. A., "Structured Codebook Design in CELP", Proc. International Mobile Satellite Conference, p. 667–672, 1991).

SUMMARY OF THE INVENTION

An object of the present invention is therefore to provide a vector quantizer, which requires less performance while being high in performance.

According to the present invention, there is provided a vector quantizer having a memory with a plurality of base vectors stored therein, for forming an output codevector through linear coupling of integer coefficients of the stored base vectors and generating an output codevector with a predetermined number of bits from a combination of the integer coefficients corresponding to an index, the vector quantizer comprising: a first vector quantizing means for selecting at least one of integer coefficient combinations or index combinations on the basis of an evaluation reference determined by a predetermined procedure by using an input vector and the plurality of base vectors; and a second vector quantizing means for selecting a desired coefficient vector from the integer coefficients of the plurality of base vectors on the basis of the evaluating reference by using the output of the first vector quantizing means and the input vector.

The first vector quantizing means includes means for generating a codevector from the base vectors and the indexes, means for calculating an evaluation function from the generated codevector and the input vector on the basis of the evaluation reference, and means for selecting and outputting a combination of a predetermined number of indexes in the order of smaller calculated evaluation functions.

The second vector quantizing means includes means for executing the codevector selection according to each of the indexes in the index combination outputted from the first vector quantizer, means for generating an output codevector from the selected coefficient codevector and the plurality of base vectors, means for calculating the difference between the generated output codevector and the input vector, and means for selecting and outputting an index giving a minimum error as the calculated error.

The vector quantizer further comprises means for calculating the impulse response or the like of a linear prediction synthesis filter, for which linear prediction coefficients based on liner prediction is provided through linear prediction analysis of the input vector.

In the present invention, the computational effort is reduced by the provision of a first vector quantizer for generating a number of output codevectors as determined by a predetermined bit number through linear coupling of integer coefficients of a predetermined number of base vectors, and a second vector quantizer for determining the coefficients of the base vectors according to at least one output index provided from the first vector quantizer.

Other objects and features will be clarified from the following description with reference to attached drawings.

PREFERRED EMBODIMENTS OF THE INVENTION

Embodiments of the present invention will now be described with reference to the drawings.

Figure 1:
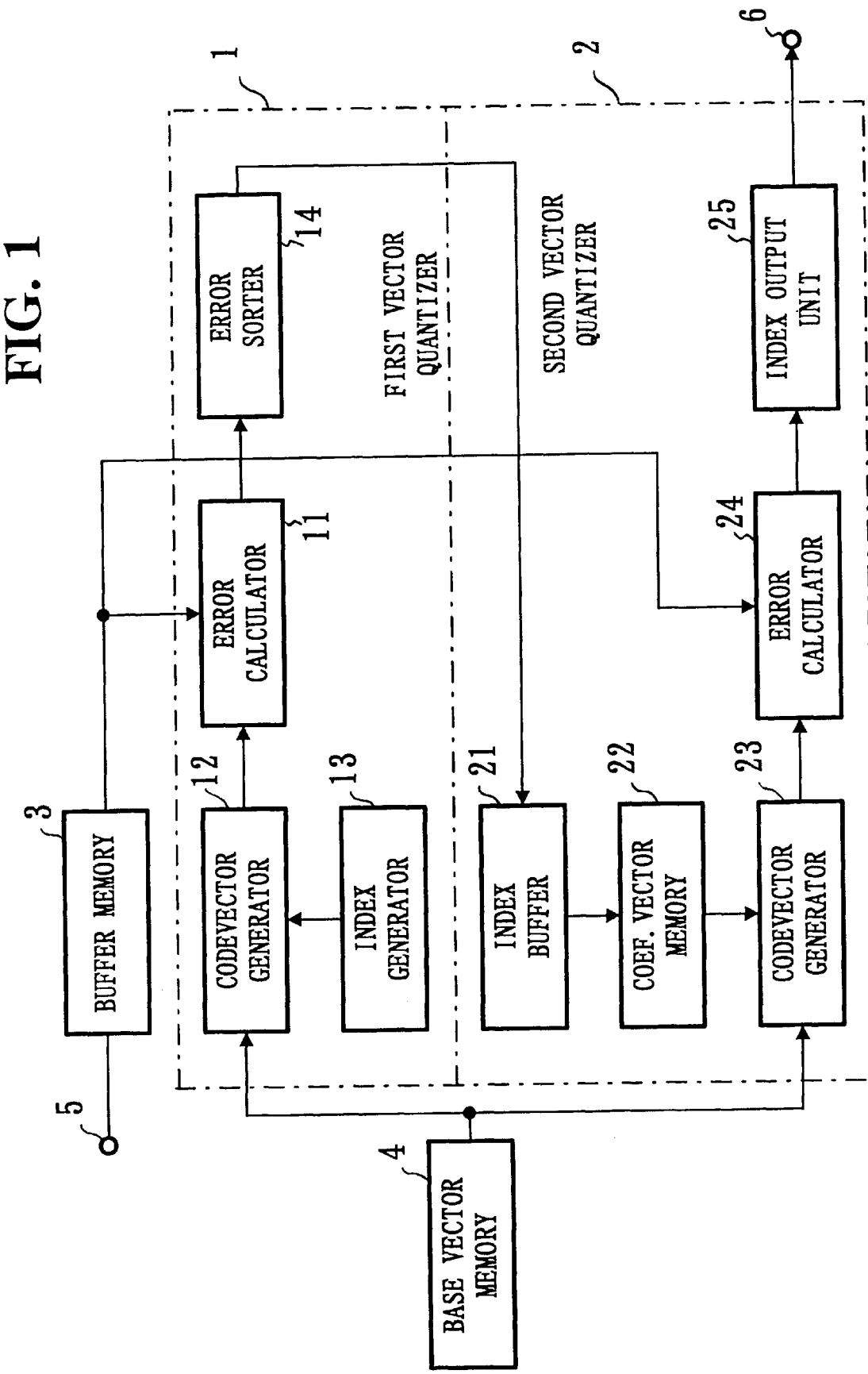
FIG. 1 shows a block diagram showing an embodiment of the present invention.

FIG. 1 is a block diagram showing an embodiment of the present invention. Referring to the figure, the embodiment of the vector quantizer according to the present invention comprises a buffer memory 3 for storing input vectors supplied from an input terminal 5, a first and a second vector quantizers 1 and 2, and a base vector memory 4 with a plurality of base vectors stored therein.

The first vector quantizer 1 adopts the vector sum quantizing system. Hereinafter, it is assumed that the number of vector dimensions is L, the quantizing bit number per vector is M, and the output codevector number is $2^M$.

Referring to FIG. 1, an input vector $X_n$ supplied from the input terminal 5 is fed to the buffer memory 3 and thence to an error calculator 11. In the base vector memory 4, M predetermined base vectors $\{a_i, i=1, \ldots, M\}$ are stored.

Figure 2:
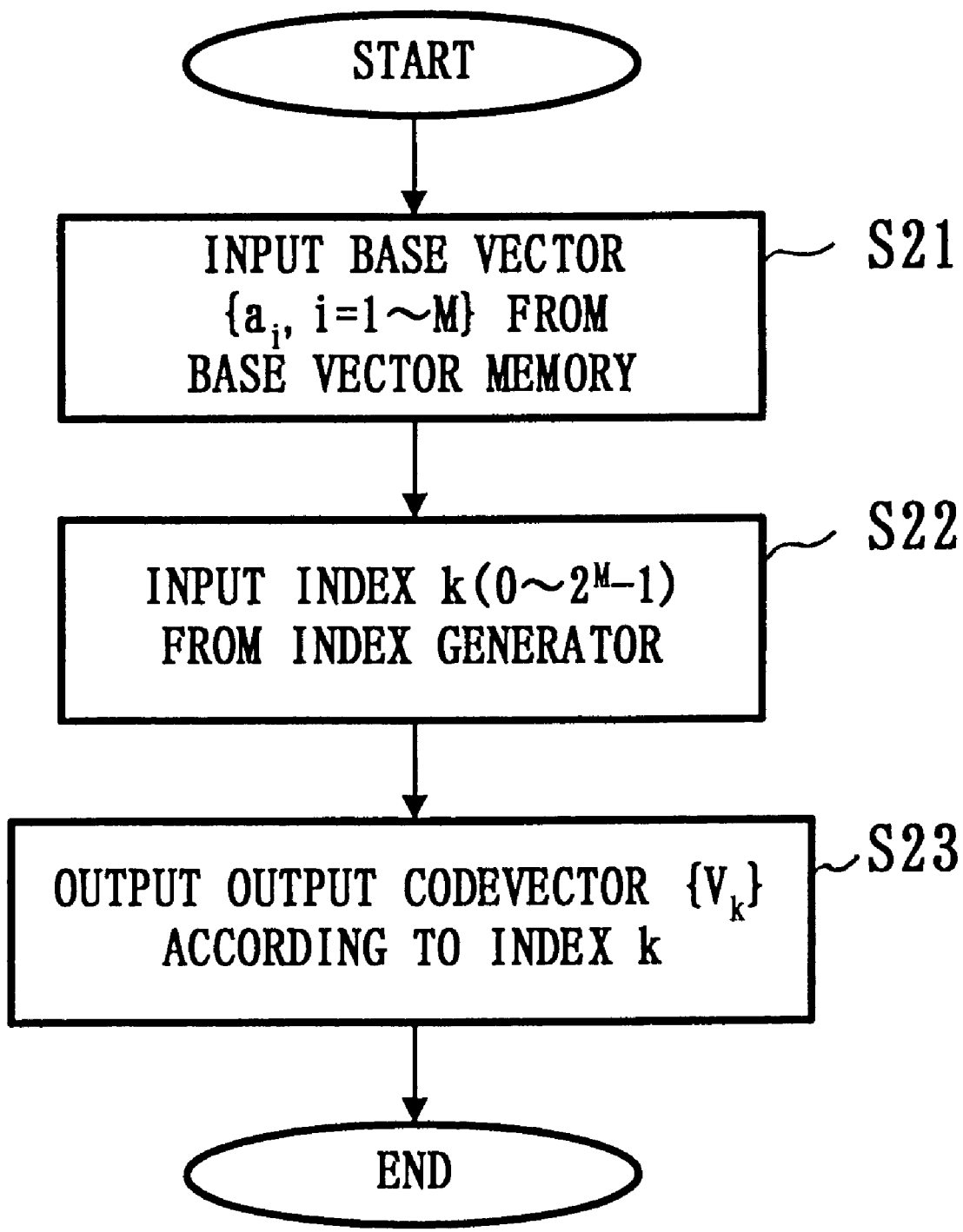
FIG. 2 shows a flow chart of the operation of the codevector generator 12.

A codevector generator 12 receives a base vector from the base vector memory 4 (step S21 in FIG. 2), generates an output codevector $\{v_k\}$ (step S23) based on an index k (of "0" to "$2^M-1$") received from an index generator 13 (step S22). The output codevector $v_k$ is given by equation (1).

Figure 3:
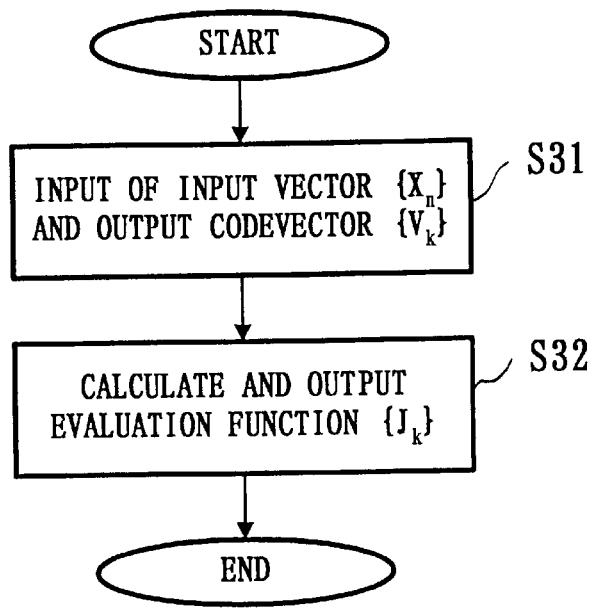
FIG. 3 shows a flow chart of the operation of the error calculator 11.

An error calculator 11 receives the output codevector $v_k$ from the codevector generator 12 and an input vector $X_n$ (step S31 in FIG. 3), and according to these received data it calculates an evaluation function $\{J_k, k=0, \ldots, 2^{M-1}\}$ using equation (3) and outputs the result of the calculation to an error sorter 14 (step S32).

Figure 4:
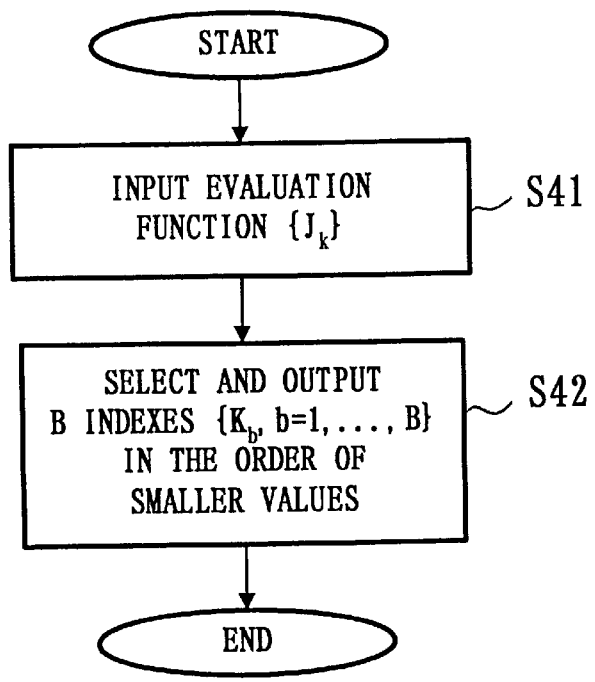
FIG. 4 shows a flow chart of the operation of the error sorter 14.

The error sorter 14 receives the evaluation function $J_k$ from the error sorter 11 (step S41 in FIG. 4), and then it selects B indexes $\{k_b, b=1, \ldots, B\}$ in the order of smaller values and outputs these indexes to an index buffer 21 in the second vector quantizer 2 (step S42).

Figure 5:
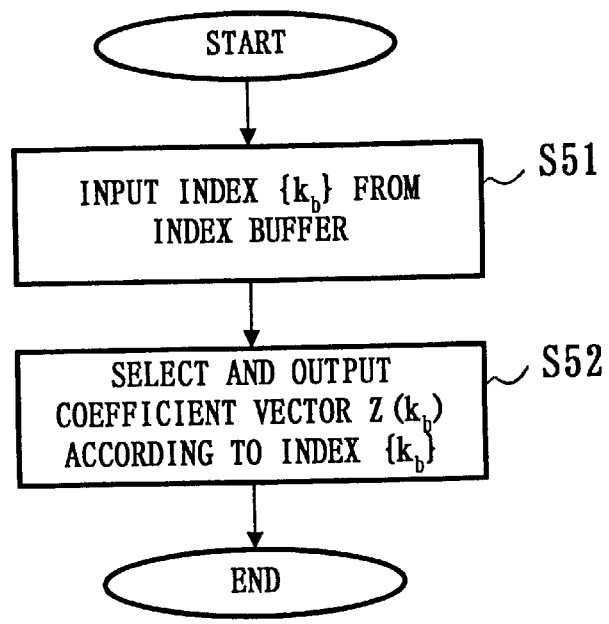
FIG. 5 shows a flow chart of the operation of the coefficient vector memory 22.

A coefficient vector memory 22 receives each index $k_b$ from the index buffer 21 (step S51 in FIG. 5), and according to the received index it selects a coefficient vector $z(k_b)$, $z(k_b)=[z(k_b)_1, \ldots, z(k_b)M]^t$ and outputs the selected coefficient vector z(kb) to a codevector generator 23 (step S52).

Figure 6:
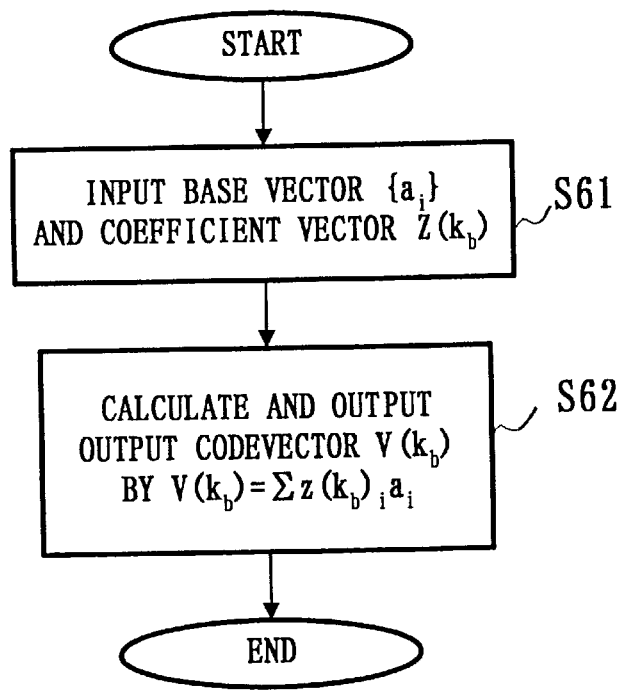
FIG. 6 shows a flow chart of the operation of the codevector generator 23.

The codevector generator 23 generates codevectors. Specifically, it receives a base vector $a_i$ from the base vector memory 4, and from this base vector and the coefficient vector $z(k_b)$ received from the coefficient vector memory 32 (step S61 in FIG. 6) it calculates an output codevector $v(k_b)$ as:

$$v(k_b)=\Sigma z(k_b)_i a_i \qquad (5)$$

(step S62).

Figure 7:
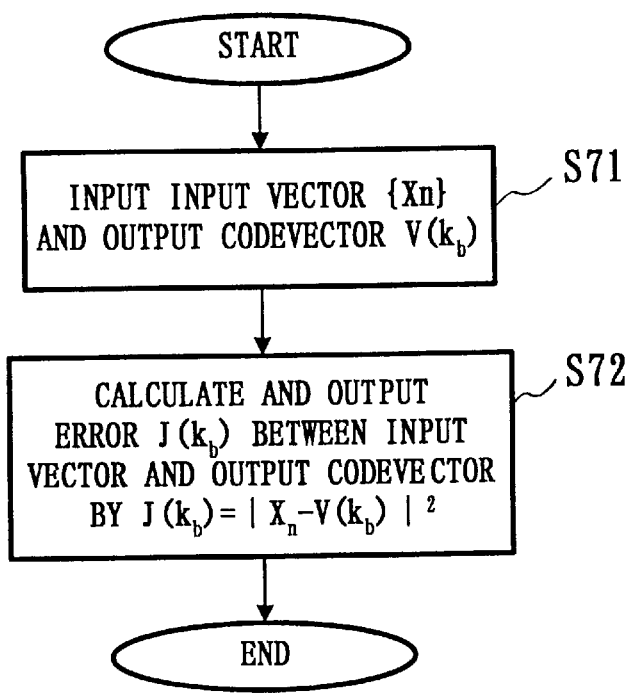
FIG. 7 shows a flow chart of the operation of the error calculator 24.

The output codevector $v(k_b)$ calculated in this way is supplied to an error calculator 24. The error calculator 24 also receives an input vector from the buffer memory 3 (step S71 in FIG. 7), and calculates the error $J(k_b)$ between the two input vectors as:

$$J(k_b) = |x_n - v(k_b)|^2 \quad (6)$$

(step S72).

Figure 8:
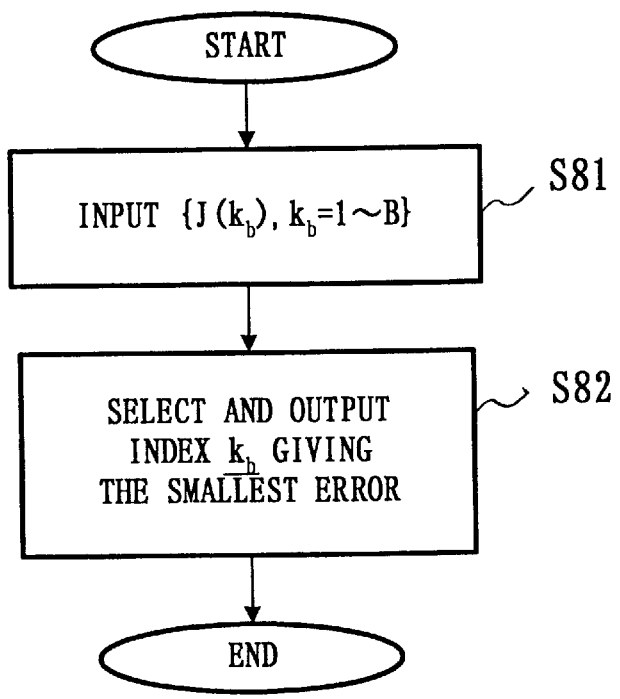
FIG. 8 shows a flow chart of the operation of the index output unit 25.

An index output unit 25 receives the outputted error $J(k_b)$ (step S81 in FIG. 8), and it selects an index $\underline{k}_b$ which gives the minimum error as the error $J(k_b)$ and outputs the selected error from an output terminal 6.

In the case where the number B of indexes outputted from the first vector quantizer 1 is "1", the process in the second vector quantizer 2 can be skipped. In this case, the output codevector is expressed as:

$$v(\underline{k}_b) = \Sigma z(\underline{k}_b)_i a_i \quad (7)$$

A second embodiment will now be described with reference to drawings. In the first embodiment shown in FIG. 1, mean square error over the vector degree is used as a distance measure when calculating the error $J_k$ or $J(k_b)$ between the input vector and the output codevector. However, it is possible that the distance measure of the error calculation is dependent on the input vector characteristic.

For example, denoting linear prediction coefficients that is determined as a result of a J-degree linear prediction analysis for the pertinent input vector or a plurality of input vectors including the pertinent input vector by $\{a_k(j), j=1, \ldots, J\}$ and an impulse response of a linear prediction synthesizing filter having the coefficients as $\{h_k(j), j=1, \ldots, L-1\}$, $J_k$ can be given as:

$$J_k = |H_k(x_n - \Sigma u_{ki} a_i)|^2 \quad (8)$$

where $$H_k = \begin{vmatrix} h_k(0) & 0 & 0 & \cdots & 0 \\ h_k(1) & h_k(0) & 0 & \cdots & 0 \\ \vdots & h_k(1) & \ddots & & \vdots \\ \vdots & \vdots & \vdots & \ddots & \vdots \\ h_k(L-1) & h_k(L-2) & \cdots & \cdots & h_k(0) \end{vmatrix} \quad (9)$$

Figure 9:
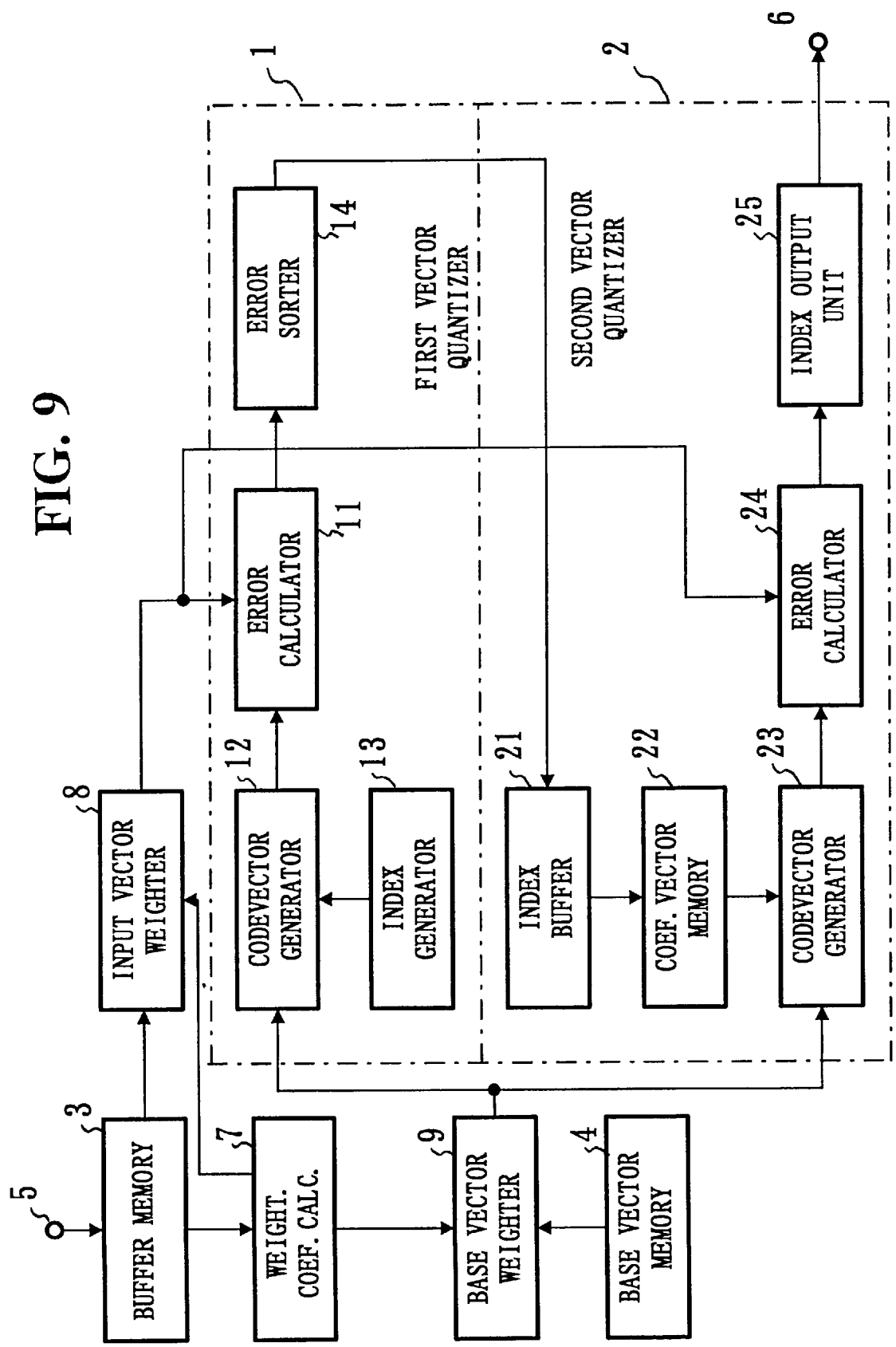
FIG. 9 shows another embodiment of the present invention.

In this case, by preliminarily calculating $H_k x_n$, and $\{H_k a_i, i=1, \ldots, M\}$ and making changes $x_n \leftarrow H_k X_n$ and $a_i \leftarrow H_k a_i$, the procedure of calculation of $J_k$ is the same as equation (3). FIG. 9 shows an embodiment in this case.

In this case, a weighting coefficient calculator 7 derives $H_k$, a base vector weighter 9 calculates $\{H_k a_i\}$, and an input vector weighter 8 calculates $H_k x_n$. For the remainder of the constitution, the embodiment is the same as the first embodiment shown in FIG. 1.

Figure 10:
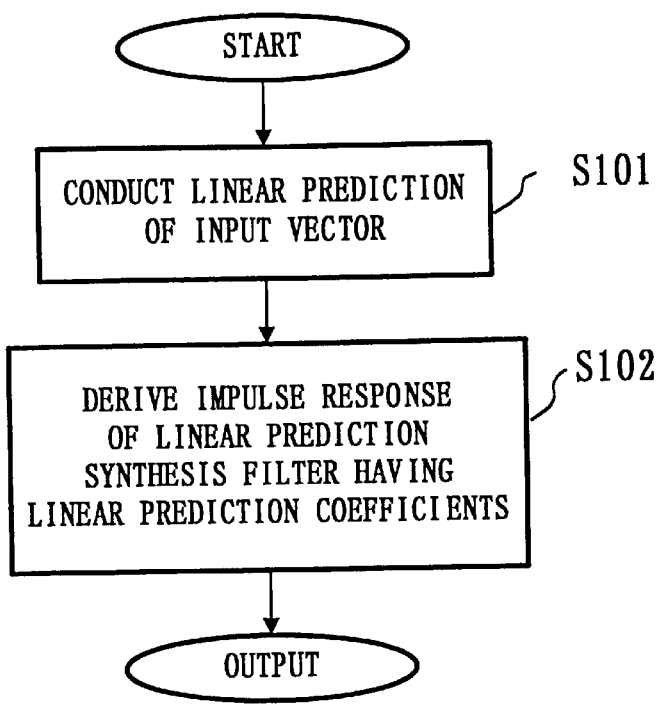
FIG. 10 shows a flow chart of the operation of the weighting coefficient calculator 7 in FIG. 9.

Referring to FIG. 9, the weighting coefficient calculator 7 executes an operation as shown in the flow chart of FIG. 10. Specifically, it executes linear prediction of an input vector in the buffer memory 3 (step S101), and derives an impulse response $\{h_k(j)\}$ of a linear prediction synthesizing filter having linear prediction coefficients $\{a_i\}$ that is determined as a result (step S102).

Figure 11:
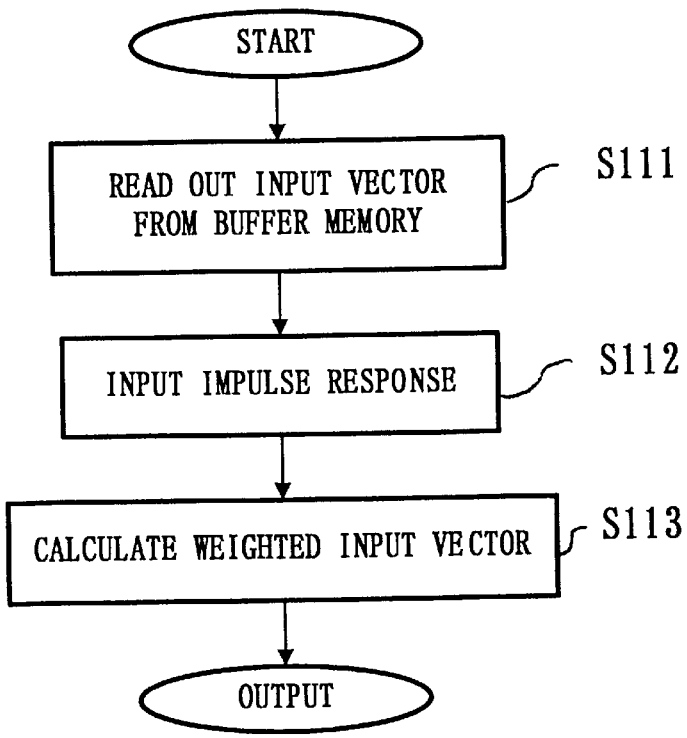
FIG. 11 shows a flow chart of the operation of the input vector weighter 8.

The input vector weighter 8 executes an operation as shown in the flow chart shown in FIG. 11. Specifically, it reads out the input vector $\{x_n\}$ from the buffer memory 3 (step S111), receives the impulse response from the weighting coefficient calculator 7 (step S112), and calculates a weighted input vector $H_k x_n$ (step S113).

Figure 12:
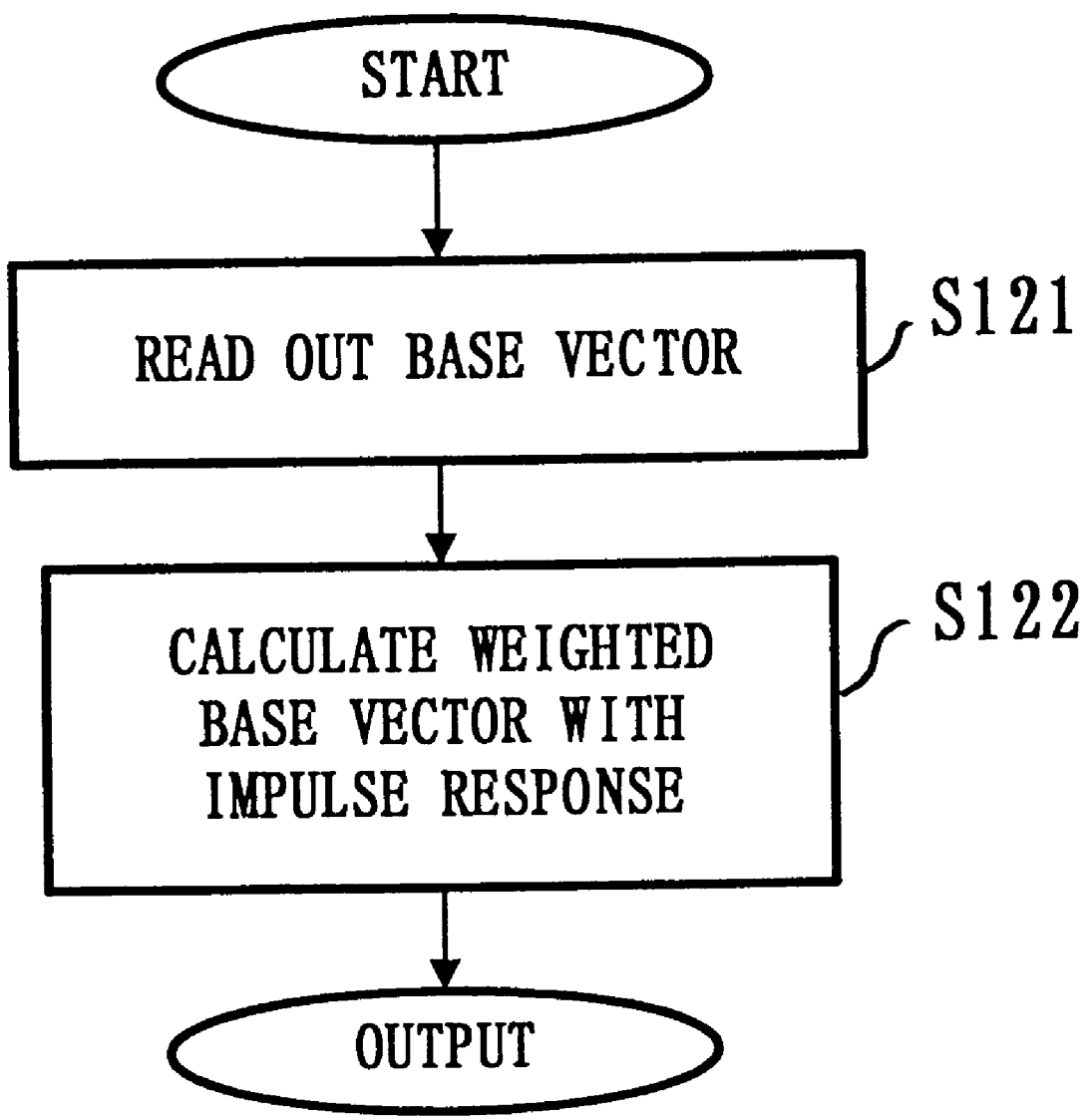
FIG. 12 shows a flow chart of the operation of the base vector weighter 9.

The base vector weighter 9 executes an operation as shown in the flow chart of FIG. 12. Specifically, it reads out a base vector from the base vector memory 4 (step S121), and calculates $H_k a_i$ by using the impulse response received from the weighting coefficient calculator 7 (step S122).

Figure 13:
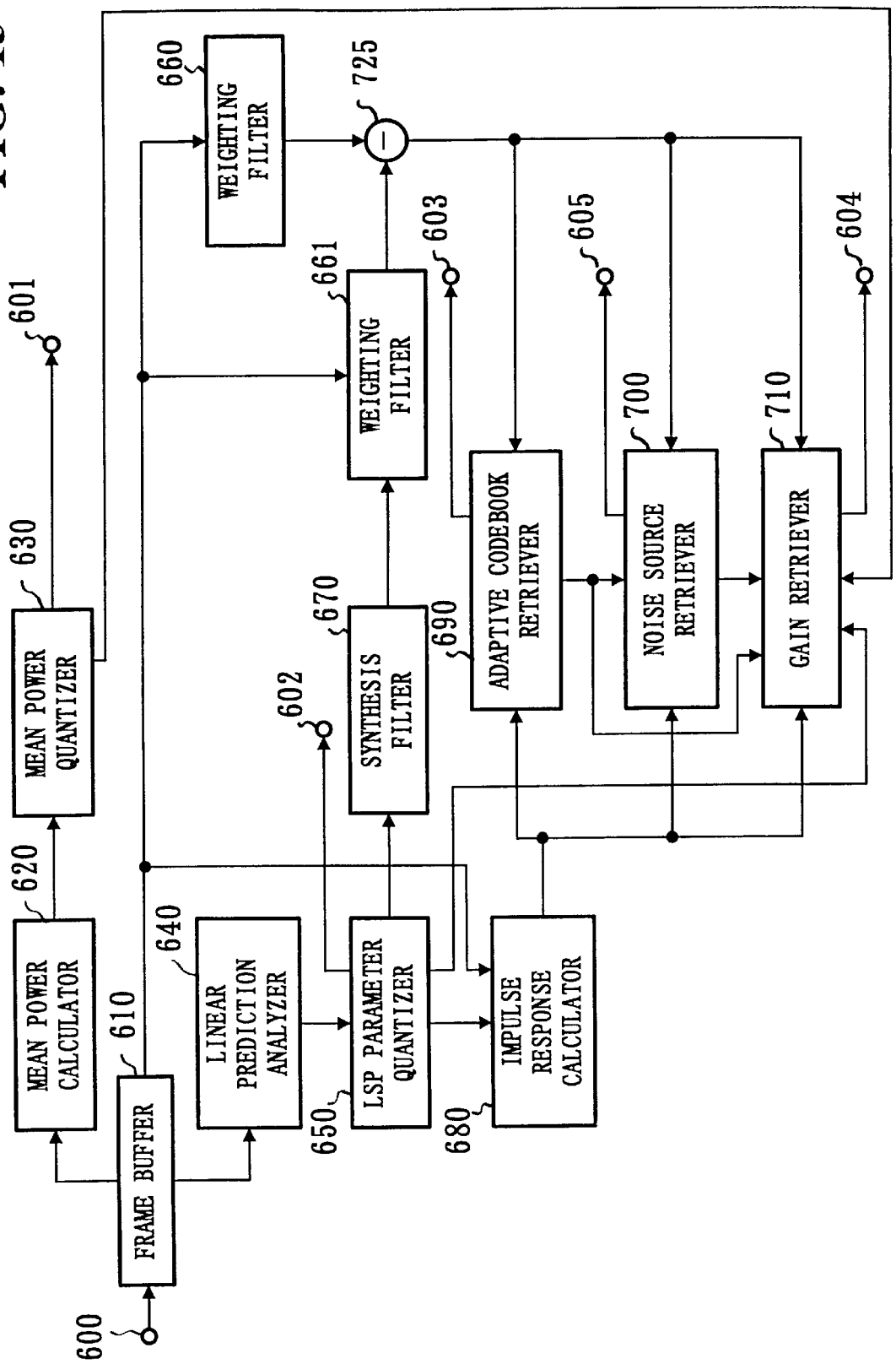
FIG. 13 shows an embodiment of the present invention applied to a speech coder.

FIG. 13 shows an embodiment of the present invention applied to a speech coder. In the following description, it is assumed that the frame length is $L_{frm}$, the sub-frame length is $L_{sub}$, the sub-frame number is $N_{sub}$, and the pertinent sub-frame index is $n_{sub}$.

Referring to the figure, the speech signal $\{x_{buf}(n), n=0, \ldots, L_{buf}-1\}$ of sample $L_{buf}(\geq L_{frm})$ supplied from an input terminal 600 is stored in a frame buffer 610. With $\{x_{buf}\}$ in the frame buffer 610, a linear prediction analyzer 640 derives an $M_{lpc}$-degree linear prediction coefficient $f\{\alpha_i, i=1, \ldots, M_{lpc}\}$ and a corresponding LSP parameter $\{lsp_i, i=1, \ldots, M_{lpc}\}$, and outputs $\{a_i\}$ to weighting filters 660 and 661 and an impulse response calculator 680, while outputting $\{lsp_i\}$ to an LSP parameter quantizer 650.

The linear prediction coefficient and the LSP parameters may be derived from the input speech signal in a well-known method as disclosed in, for instance, Sugamura and Itakura, "Speech Information Compression by Linear Spectrum Pair (LSP) Speech Analysis Synthesizing System", IECE Japan, Trans. J64-A, 8, pp. 599–606, 1981.

An LSP parameter quantizer 650 quantizes LSP parameters supplied from the linear prediction analyzer 640, and outputs an index obtained as result of the quantization to an output terminal 602 and linear prediction coefficients $\{\alpha i\}$ corresponding to the quantization of the LSP to a synthesizing filter 670 and also to the impulse response calculator 680. It further outputs a normalized prediction error errnorm determined by a PARCOR coefficient $\{par_i\}$ corresponding to the linear prediction coefficient to a gain retriever 710.

The quantization of the LSP parameter may be executed by using a multiple stage method based on vector quantization and split vector quantization as proposed in, for instance, Ohya, Suda and Miki, "Pitch Synchronous Innovation CELP (PSI-CELP)", IECE Technical Report, RCS93078, pp. 63–70, 1993.

The normalized prediction error errnorm is obtained from $\{par_i\}$ usually by using:

$$errnorm = \sqrt{L_{sub} \prod_{i=1}^{M_{lpc}} (1 - par_i^2)} \quad (10)$$

A mean power calculator 620 estimates mean power RO per frame of the input speech signal, and outputs the estimated mean power to a mean power quantizer 630. The mean power quantizer 630 quantizes RO, and outputs an index thereof from an output terminal 601, while outputting rms=√(RO) to the gain retriever 710.

A weighting filter 660 converts the input speech signal $\{x(n), n=0, \ldots, L_{sub}-1\}$ of a pertinent sub-frame supplied from a frame buffer 610 into a weighted input speech signal $\{x(n), n=0, \ldots, L_{sub}-1\}$, and outputs the weighted input speech signal to a subtracter 725. Here, $$x(n) = x_{buf}(n_{sub} \times L_{sub} + n) \quad (11)$$

and $$x_w(n) = x(n) + \sum_{i=1}^{M_{lpc}} \alpha_i \gamma_1^i x(n-i) - \sum_{i=1}^{M_{lpc}} \alpha_i \gamma_2^i x_w(n-i) \quad (12)$$

In the above equation, $\gamma_1$ and $\gamma_2$ are constants which are set such as to satisfy $0<\gamma_1$ and $\gamma_2<1$.

The subtractor 725 subtracts the influence of the past sub-frame. Specifically, it calculates the past influence of the weighting filter 661 and the synthesizing filter 670 as:

$$\tilde{x}_w(n) = y(n) + \sum_{i=1}^{M_{lpc}} \alpha_i \gamma_1^i y(n-i) - \sum_{i=1}^{M_{lpc}} \alpha_i \gamma_2^i \tilde{x}_w(n-i) \quad (13)$$

$$y(n) = -\sum_{i=1}^{M_{lpc}} \hat{\alpha}_i y(n-i) \quad (14)$$

and converts this past influence into $$x_w(n) \Leftarrow x_w(n) - \tilde{x}_w(n) \quad (15)$$

Then, it outputs $\{x_w\}$ in the left side of the equation to an adaptive codebook retriever 690, a noise source retriever 700 and the gain retriever 710.

An impulse response calculator 680 derives an impulse response of a cascade filter, which is formed by a synthesizing filter constituted by $\{\alpha_i\}$ supplied from an LSP parameter quantizer 650 and a weighting filter constituted by $\{\alpha_i\}$ supplied from a linear prediction analyzer 640. The impulse response is calculated as:

$$\begin{cases} h_w(n) = h(n) + \sum_{i=1}^{M_{lpc}} \alpha_i \gamma_1^i h(n-i) - \sum_{i=1}^{M_{lpc}} \alpha_i \gamma_2^i h_w(n-i) \\ h(n) = \zeta(n) - \sum_{i=1}^{M_{lpc}} \hat{\alpha}_i h(n-i) \end{cases} \quad (16)$$

and outputted to the adaptive codebook retriever 690, noise retriever 760 and gain retriever 710.

The adaptive codebook retriever 690 has a buffer memory for storing excitation signal determined in the past, and from the excitation signal in the buffer memory, quantized linear prediction coefficient $\{\alpha_i\}$ supplied from the LSP quantizer 650 and linear prediction coefficient $\{\alpha_i\}$ supplied from the linear prediction analyzer 640 it derives a continuous excitation signal for $L_{sub}$ samples that best represents the weighted input speech signal $\{x_w(n)\}$ of the pertinent sub-frame and coefficients of that excitation signal.

The excitation signal $\{V_{adp}(n), n=0, \ldots, L_{sub}-1\}$ for $L_{sub}$ samples is an adaptive codevector and is outputted together with its coefficient $g_{adp}$ to the noise source retriever 700. An index representing the relative position of the adaptive codevector in the buffer memory is outputted to the outside.

The adaptive codevector may be derived by a well-known method, for instance described in Kroon, P. and Atal B. S., "Pitch Predictors with High Temporal Resolution", Proc. IEEE ICASSP, pp. 661–664, 1990, or in Kleijn, W. B., Krasinski D. J., and Ketchum R. H., "Improved Speech Quality and Efficient Vector Quantization", Proc. IEEE ICASSP, pp. 155–158, 1988.

The noise source retriever 700 derives a noise source signal that best represents the weighted input speech signal $\{x_w(n)\}$ of the pertinent sub-frame on the basis of the quantized linear prediction coefficient $\{\alpha_i\}$ supplied from the LSP quantizer 650, linear prediction coefficient $\{\alpha_i\}$ supplied from the linear prediction analyzer 60, adaptive codevector $\{V_{adp}(n), n=0, \ldots, L_{sub}-1\}$ supplied from the adaptive codebook retriever 690 and the coefficients $g_{adp}$ thereof.

The noise source retriever 700 includes at least a first vector quantizer, which has D (D>1) base vectors and an integer coefficient vector codebook concerning the base vectors, and a second vector quantizer which has real number coefficient vectors corresponding to the base vectors. In the first vector quantization, the noise source signal $\{d_k(n), k=0, \ldots, 2^D-1, n=0, 1_{dots}, L_{sub}-1\}$ is given as:

$$d_k(n) = \sum_{i=1}^{D} u_{ki} \alpha_i(n) \quad (17)$$

where $\{u_{ki}\}$ is "1" or "−1".

In the second vector quantization, $d_k(n)$ is given in terms of the real number coefficient codevectors $\{r_{ki}, k=0, \ldots, 2^D-1, i=1, 1_{dots}, D\}$ as:

$$d_k(n) = \sum_{i=1}^{D} r_{ki} \alpha_i(n) \quad (18)$$

In each vector quantization, the coefficient codevector retrieval reference is $$J_k = \frac{(d_k^t H_w t_x)^2}{d_k^t H_w^t H_w d_k^t} \quad (19)$$

$t_x = x_w - g_{adp} H_w v_{adp}$ $x_w = [x_w(0) \cdots x_w(L_{sub}-1)]$ $$H_w = \begin{bmatrix} hw(0) & 0 & \cdots & 0 \\ hw(1) & hw(0) & \cdots & 0 \\ \vdots & \ddots & \ddots & \vdots \\ hw(L_{sub}-1) & \cdots & hw(1) & hw(0) \end{bmatrix}$$

$v_{adp} = [v_{adp}(0) \cdots v_{adp}(L_{sub}-1)]$ $d_k = [d_k(0) \cdots d_k(L_{sub}-1)]$ As mentioned before, in the first vector quantization the integer coefficients of the base vectors are such that $u_{(k+1)i} = -u_{ki}$ and $u_{(k+1)j} = u_{kj}$, $(j \neq i)$, and the evaluation function can be calculated progressively by using an equation:

$$J_{k+1} = \frac{(E_k^d + 2u_{(k+1)i} S_i)^2}{E_k^n + 4 \sum_{m=1}^{i-1} u_{(k+1)m} u_{(k+1)i} R_{mi} + 4 \sum_{m=i+1}^{D} u_{(k+1)m} u_{(k+1)i} R_{mi}} \quad (20)$$

where $E_k^d$ and $E_k^n$ are $E_k^d = d_k^t H_w t_x$ $E_k^n = d_k^t H_w^t H_w d_k^t \quad (21)$ and $S_i$ and $R_{mi}$ are $S_i = a_i^t t_x$ $R_{mi} = a_m^t H_w^t H_w a_m \quad (22)$ In the first vector quantizer, Bcnd indexes $\{k_b=1, \ldots, B_{cnd}\}$ are selectively outputted in the order of smaller values of $\{J_k\}$ calculated in the above way to the second vector quantizer. In the second vector quantizer, an index for minimizing $$J_{kb} = \frac{(d_{k_b}^t H_w I_x)^2}{d_{k_b}^t H_w^t H_w d_{k_b}^t} \quad (23)$$

is retrieved from real number coefficient vectors $\{k_b\}$ corresponding to the selected indexes $\{k_b\}$. The retrieved index is $$d_{kb} = \sum_{i=1}^{D} r_{ki} \alpha_i \quad (24)$$

The index of the noise source which minimizes equation (24) is outputted to an output terminal 605, and a noise source codevector $d_{kb}$ corresponding to that index is outputted to a gain retriever 710. By using the adaptive codevector $V_{adp}$ supplied from the adaptive codebook retriever 690, the noise source codevector $d_{kp}$ supplied from the noise source retriever 700 and the quantized linear prediction coefficient $\{\alpha_i\}$ supplied from the LSP quantizer 650, the gain retriever 710 retrieves an adaptive codevector best representing the weighted input speech signal $\{x_w(n)\}$ of the pertinent sub-frame and a gain codevector as a coefficient of the noise source codevector $d_{kp}$.

The gain codevector is calculated such as to minimize $$J_m = -2(g_m^v v_{adp} + g_m^d d_{k_b})^t H_w^t x_w + (g_m^v v_{adp} + g_m^d d_{k_b})^t H_w^t H_w (g_m^v v_{adp} + g_m^d d_{k_b}) \quad (25)$$

An index of the codevector for minimizing the above equation is outputted from an output terminal 604. The gain codevector that is actually stored in the gain codebook is, using errnorm supplied from the LSP quantizer 650 and rms supplied from the mean power quantizer 630, $$\hat{g}_m^v = \frac{g_m^v \times \text{rms} \times \text{errnorm}}{\sqrt{\sum_{n=0}^{L_{sub}-1} v_{adp}^2}} \quad (26)$$

$$\hat{g}_m^d = \frac{g_m^d \times \text{rms} \times \text{errnorm}}{\sqrt{\sum_{n=0}^{L_{sub}-1} v_{k_b}^2}}$$

The predetermined pertinent sub-frame excitation signal $$e(n) = g_m^d v_{adp}(n) + g_m^d d_{k_b}(n) \quad (27)$$

is used to update the excitation buffer memory in the adaptive codebook retriever. Also, a signal $$\begin{cases} \hat{x}_w(n) = \hat{x}(n) + \sum_{i=1}^{M_{lpc}} \alpha_i \gamma_1^i \hat{x}(n-i) - \sum_{i=1}^{M_{lpc}} \alpha_i \gamma_2^i \hat{x}_w(n-i) \\ \hat{x}_w(n) = e(n) + \sum_{i=1}^{M_{lpc}} \hat{\alpha}_i \hat{x}(n-i) \end{cases} \quad (28)$$

which is synthesized from the excitation signal $\{e(n)\}$ is used to update memories in the synthesizing and weighting filters 670 and 661.

When the above sub-frame routine is completed for one frame, the indexes which are outputted from the output terminals 601 to 605 are multiplexed and then sent to the decoding side.

As has been described in the foregoing, the vector quantizer according to the present invention which forms output codevectors through linear coupling of a plurality of base vectors, adopts integer coefficients for the first vector quantization and adopts a second vector quantization with real number coefficients only for a small number (the least number being "1") of indexes outputted from the first vector quantizer. It is thus possible to obtain high performance vector quantization with little computational effort increase compared to the prior art vector quantization such as the vector sum vector quantization or lattice vector quantization. In the case where the number of indexes outputted from the first vector quantization is "1", the total computational effort is only that for the vector quantization.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A vector quantizer having a memory with a plurality of base vectors stored therein, for forming an output codevector through linear coupling of integer coefficients of the stored base vectors and generating an output codevector with a predetermined number of bits from a combination of the integer coefficients corresponding to an index, the vector quantizer comprising:

a first vector quantizing means for selecting at least one of integer coefficient combinations or index combinations on the basis of an evaluation reference determined by a predetermined procedure by using an input vector supplied from an input terminal and the plurality of base vectors; and a second vector quantizing means for selecting a desired coefficient vector from the integer coefficients of the plurality of base vectors on the basis of the evaluating reference by using the output of the first vector quantizing means and the input vector.

2. The vector quantizer according to claim 1, wherein the first vector quantizing means includes means for generating a codevector from the base vectors and the indexes, means for calculating an evaluation function from the generated codevector and the input vector on the basis of the evaluation reference, and means for selecting and outputting a combination of a predetermined number of indexes in the order of smaller calculated evaluation functions.

3. The vector quantizer according to claim 2, which further comprises means for calculating the impulse response or the like of a linear prediction synthesis filter, for which linear prediction coefficients based on linear prediction is provided through linear prediction analysis of the input vector.

4. The vector quantizer according to claim 1, wherein the second vector quantizing means includes means for executing the codevector selection according to each of the indexes in the index combination outputted from the first vector quantizer, means for generating an output codevector from the selected coefficient codevector and the plurality of base vectors, means for calculating the difference between the generated output codevector and the input vector, and means for selecting and outputting an index giving a minimum error as the calculated error.

5. The vector quantizer according to claim 4, which further comprises means for calculating the impulse response or the like of a linear prediction synthesis filter, for which linear prediction coefficients based on linear prediction is provided through linear prediction analysis of the input vector.

6. The vector quantizer according to claim 1, which further comprises means for calculating the impulse response or the like of a linear prediction synthesis filter, for which linear prediction coefficients based on linear prediction is provided through linear prediction analysis of the input vector.

* * * * *